US006653715B2

(12) United States Patent
Kondo et al.

(10) Patent No.: US 6,653,715 B2
(45) Date of Patent: Nov. 25, 2003

(54) BIPOLAR TRANSISTOR

(75) Inventors: Masao Kondo, Higashimurayama (JP); Katsuya Oda, Hachioji (JP); Katsuyoshi Washio, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/237,674

(22) Filed: Sep. 10, 2002

(65) Prior Publication Data
US 2003/0006485 A1 Jan. 9, 2003

Related U.S. Application Data

(63) Continuation of application No. 09/983,143, filed on Oct. 23, 2002, now Pat. No. 6,469,367, which is a continuation of application No. 09/376,352, filed on Aug. 18, 1999, now Pat. No. 6,388,307.

(30) Foreign Application Priority Data

Aug. 19, 1998 (JP) ............................................ 10-232555

(51) Int. Cl.$^7$ ......................... H01L 27/82; H01L 29/70
(52) U.S. Cl. ....................................... 257/592; 257/591
(58) Field of Search ................................. 257/591, 592

(56) References Cited

U.S. PATENT DOCUMENTS 5,177,583 A * 1/1993 Endo et al. .................. 257/190
5,302,841 A    4/1994  Yamazaki
5,323,031 A    6/1994  Shoji et al.
5,656,514 A    8/1997  Ahlgren et al.
5,766,999 A    6/1998  Sato
5,846,867 A   12/1998  Gomi et al.

FOREIGN PATENT DOCUMENTS

JP      283533 A    10/1997

OTHER PUBLICATIONS

Oda et al, "130–GHz fT SiGe HBT Technology," Technical Digest of International Electron Devices Meeting (IEDM), 1997, pp. 791–794.

* cited by examiner

Primary Examiner—Allan R. Wilson
(74) Attorney, Agent, or Firm—Mattingly, Stanger & Malur, P.C.

(57) ABSTRACT

A bipolar transistor using a B-doped Si and Ge alloy for a base in which a Ge content in an emitter-base depletion region and in a base-collector depletion region is greater than a Ge content in a base layer. Diffusion of B from the base layer can be suppressed by making the Ge content in the emitter-base depletion region and in a base-collector depletion region on both sides of the base layer greater than the Ge content in the base layer since the diffusion coefficient of B in the SiGe layer is lowered as the Ge contents increases.

8 Claims, 15 Drawing Sheets

BIPOLAR TRANSISTOR

This is a continuation application of U.S. Ser. No. 09/983,143, filed Oct. 23, 2002 now U.S. Pat. No. 6,469, 367, which is a continuation application of U.S. Ser. No. 09/376,352 filed Aug. 18, 1999 now U.S. Pat. No. 6,388, 307.

FIELD OF THE INVENTION

The present invention concerns a bipolar transistor having an SiGe alloy base layer and, more in particular, it relates to a bipolar transistor suitable to a ultra-high-speed digital IC and microwave or millimeter wave wireless communication IC, as well as a communication system in which the bipolar transistor is applied.

BACKGROUND OF THE INVENTION

Prior art related to a bipolar transistor using B-doped SiGe alloy (SiGe alloy) for a base is described in Technical Digest of International Electron Devices Meeting (IEDM), 1997 (pages 791–794). The SiGe base bipolar transistor of the prior art is to be explained with reference to FIG. 17(a) and FIG. 17(b). Graphs in the drawing show typical two examples of a depth profile of impurity concentrations and Ge contents in an active region of a SiGe base bipolar transistor of the prior art (refer to FIG. 4 showing a cross section for the main portion of a transistor; along broken line A) of the prior art. In the graphs, a region of a shallow depth is for an emitter and a portion with a large depth is for a collector. In the example shown in FIG. 17(a), the Ge content increases at a constant grade toward the collector in a region of a base layer in which B is doped, reaches a maximum value at an edge of the base layer, and is kept at the maximum value in a region of a predetermined width in a base-collector depletion layer. In the example shown by FIG. 17(b), the Ge content has a constant value in a region of the base layer in which B is doped and in a region of a predetermined width in the base-collector depletion layer.

For improving the operation speed of a bipolar transistor, it is necessary to shorten a base transit time of carriers and lower a base resistance. For this purpose, it is necessary for the depth profile of B in the base layer to make the width as narrow as possible and increase the concentration as high as possible. However, in the prior art described above, since B in the base layer is diffused by a heat treatment after forming the base layer, it results in a problem that the depth profile becomes broad to widen the width. In addition, since the broadening for the width of the profile due to diffusion increases as the concentration of B is higher, it was difficult to make the restriction for the width of profile and increase of the concentration compatible with each other.

Another problem in the prior art transistor is that an effective base width is widened to lower the operation speed if the collector current is increased. This is caused by injection of holes for neutralizing the negative charges due to increase of a collector current density in a region at low impurity concentration, so that an energy band structure for a base-collector junction is changed as shown in FIG. 18.

FIG. 15 shows dependence of a diffusion coefficient of B in an SiGe alloy on a Ge content. As the Ge content increases, the B diffusion coefficient decreases to lower the diffusion speed. The problem of increasing the depth of B can be solved by utilizing this phenomena by adopting the following means.

If the Ge content is increased in a region adjacent to the B-doped layer of the base, that is, in an emitter-base depletion region or a base-collector depletion region, since the diffusion speed of B in the portion is lowered, widening of the width in the depth profile of B can be suppressed.

When taking notice only on the decrease of B diffusion, the total Ge contents may be increased in the emitter-base junction depletion region, the base layer, and the base-collector depletion region, but the total amount of Ge in the SiGe alloy layer is excessively increased. Therefore, this causes strong stresses in the SiGe alloy layer due to the difference of covalent bonding radius between Si and Ge, to cause a side-effect of forming crystal defects.

The side effect can be suppressed by controlling the Ge content higher in a portion adjacent to the B-doped layer of the base and lower in the B-doped layer as much as possible. Since the total Ge content can be decreased by this structure, occurrence of crystal defects can be suppressed. In this case, broadening of the distribution of B caused by the reduction of the Ge content in the B-doped layer is almost negligible. This is because the distribution of B is generally uniform in the B-doped layer, so that B is less diffused and the degree of the diffusion coefficient in this region gives less effect on the broadening of the depth profile of B. For lowering the Ge content in the B-doped layer and kept it high in the portion adjacent therewith thereby decreasing the total Ge content as low as possible, the Ge concentration may be changed abruptly as much as possible at both ends of the B doped layer.

Further, the effect of suppressing the broadening of the B profile compared with the prior art can be attained also by making the Ge content in the emitter-base junction at least equal with the content in the B-doped layer though it is not higher than the content in the B-doped layer, by the same reason as described above.

Further, the problem that the effective base width is increased by the increase of the collector current can also be improved by the method described above of changing the Ge concentration as sharp as possible at the edge of the B-doped layer on the side of the collector. This reason is to be explained below. In a transistor of the prior art, an effective base width is increased as the collector current density increases as shown in FIG. 18 since the grade of the band become less steep at the edge of the base on the side of the collector. On the other hand, when the Ge concentration is changed abruptly at the edge of the B-doped layer, a nodge is formed in a valance band at a position at which the Ge concentration changes as shown in FIG. 2. The reverse V-shaped nodge on the side of the collector has a function of hindering the effect of smoothing the grade of the band in that portion when the collector current density increases. This is because a great amount of holes are accumulated at that portion if the grade is reduced and electrical neutral can no more be kept in the vicinity thereof. The effect of suppressing the change of the gradient of the band with increase of the collector current density can improve the problem of lowering the operation speed in a case of increasing the collector current.

SUMMARY OF THE INVENTION

Based on the considerations as described above, the present inventor provides a bipolar transistor of the following structure and a communication system by applying such a bipolar transistor.

At first, a bipolar transistor using a B-doped Si and Ge alloy (SiGe) according to the present inventor has a basic feature in that the maximum value of Ge content in an emitter-base junction depletion region and a base-collector junction depletion region is greater than an average value in the base layer. In this bipolar transistor, it is preferred that the grade of Ge content in a region in which the Ge content is increased from the vicinity of the edge of the base on the side of a collector to the collector is made greater than the average grade of Ge content in the base layer.

Further, another feature of the present invention resides in a bipolar transistor using a B-doped SiGe alloy (SiGe) for a base in which the maximum value of the Ge content in the base-collector junction depletion region is set greater than the average value in the base layer, wherein the grade of Ge content in the region in which the Ge content is increased from the vicinity of the edge of the base on the side of a collector to the collector is made greater than the average grade of the Ge content in the base layer.

In a further aspect of a bipolar transistor according to the present invention, a bipolar transistor using a B-doped Si and Ge alloy (SiGe) for a base in which the maximum value for the Ge content in the base-collector depletion region is set greater than an average value in the base layer has a region in which the Ge content is constant from the edge of the base layer on the side of the emitter to the emitter-base junction. In this structure, it is preferred that the grade of Ge content in the region in which the content increases from the vicinity of the edge of the base layer to the collector is made greater than the average grade of Ge content in the base layer.

Further, in an optical transmission system according to the present invention comprising an optical receiver system having an a photodetector for receiving an optical signal and outputting an electric signal, a first amplifier for receiving the electric signal from the photodetector, a second amplifier for receiving the output from the first amplifier, a decision circuit for converting the output from the second amplifier into a digital signal in synchronization with a predetermined clock signal, and a circuit for separating and converging the digital signal, and an optical transmitter system having a circuit for synthesizing multiple digital signals, a semiconductor laser and a semiconductor laser driver for driving the laser, at least one of transistors in the first and the second amplifiers, the decision circuit, a multiplexer for digital signals, a multiplexer for multiple digital signals and the semiconductor laser driver is constituted with the SiGe base bipolar transistor as defined above in either one of the optical receiver system and the optical transmitter system.

Further, in a millimeter wave transmission system according to the present invention having a receiving antenna for millimeter wave (frequency: 30 GHz–300 GHz), a first amplifier for amplifying a received electric signal from the antenna, a receiving mixer for receiving the output from the first amplifier and stepping-down the frequency, a first oscillator, a transmitting mixer for receiving a transmission electric signal and stepping-up the frequency, a second oscillator, and a second amplifier for receiving the output of the transmission mixer and amplifying the power, at least one of the transistors in the first and the second amplifiers, the first and the second oscillators and the transmission mixer is constituted with the SiGe base bipolar transistor as defined above.

DETAILED DESCRIPTION OF THE PREFERRED EMBODIMENTS

Preferred embodiments of a bipolar transistor according to the present invention and optical communication systems and millimeter wave transmission systems to which the bipolar transistor is applied are to be explained below with respect to preferred embodiments from 1 to 12 and related drawings to each of the embodiments.

Embodiment 1

Figure 3:
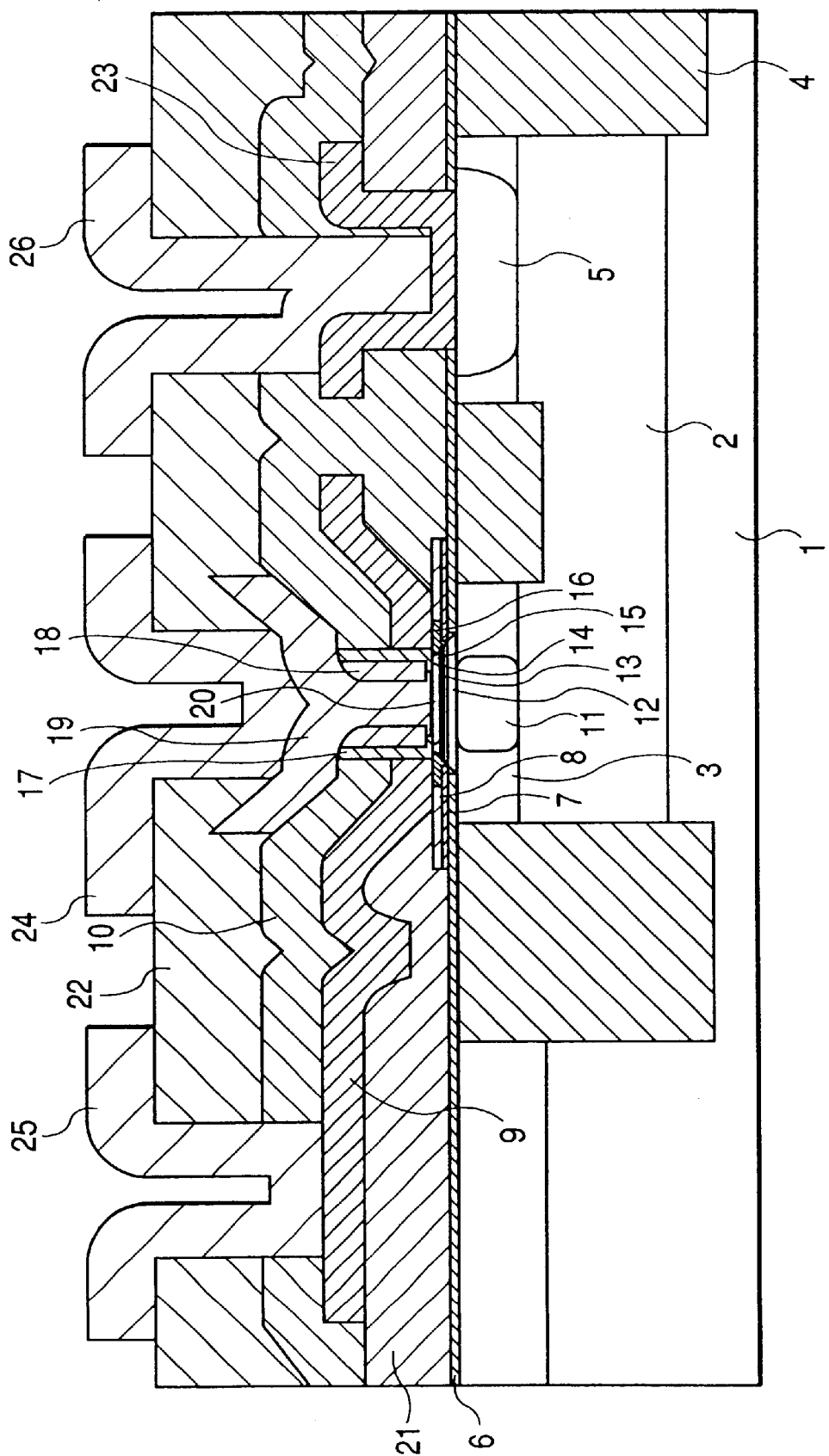
FIG. 3 shows a cross sectional structure of a bipolar transistor in the first to the seventh embodiments according to the present invention.

The first embodiment according to the present invention is to be explained with reference to FIG. 1 and to FIG. 4. FIG. 3 shows a cross sectional structure of a bipolar transistor using an SiGe alloy layer for a base in the first embodiment according to the present invention. Cross sectional structures of bipolar transistors in other embodiments according to the present invention are basically identical with those shown in this figure. In the drawing, are shown a p-type Si substrate 1, an $n^+$-type Si layer 2, a low concentration n-type Si layer 3, an $SiO_2$ film 4, an $n_+$-type Si layer 5, an $SiO_2$ film 6, a non-doped polysilicon layer 7, an $Si_3N_4$ film 8, a p-type polysilicon layer 9, an $SiO_2$ film 10, an n-type Si layer 11, a low concentration n-type SiGe film 12, a p-type SiGe layer 13, a low concentration n-type SiGe layer 14, a non-doped single crystalline Si layer 15, a p-type polycrystal SiGe layer 16, an $SiO_2$ film 17, an $Si_3N_4$ film 18, an $n^+$-type polycrystal Si film 19, an $n^+$-type Si layer 20, $SiO_2$ films 21, 22, an n-type polycrystal Si film 23, and metal electrodes 24–26. Among the metal electrodes, 24 denotes an emitter electrode, 25 denotes a base electrode and 26 denotes a collector electrode.

Figure 4:
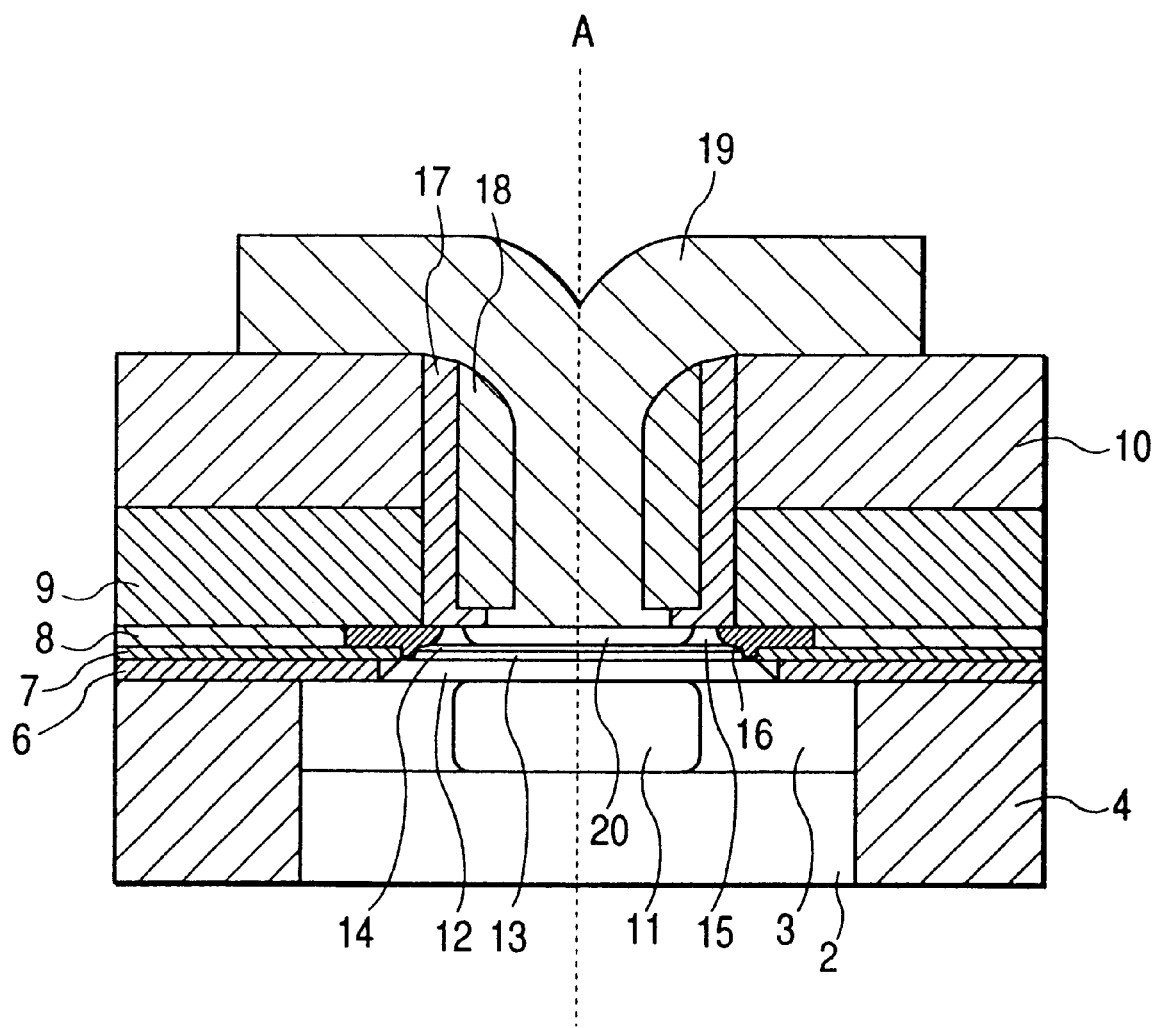
FIG. 4 shows a cross sectional structure for a main portion of a bipolar transistor in the first to the seventh embodiments according to the present invention.

FIG. 4 is a detailed cross sectional structure for a main portion of the SiGe base transistor shown in FIG. 3. Those reference numerals in this figure are identical with those shown in FIG. 1. In this case, the $n^+$-type Si layer 2 serves as a collector, the p-type polysilicon layer 9 serves as a base lead electrode, the $n^+$-type polycrystal Si film 19 and the $n^+$-type Si layer 20 serves as an emitter.

Figure 1:
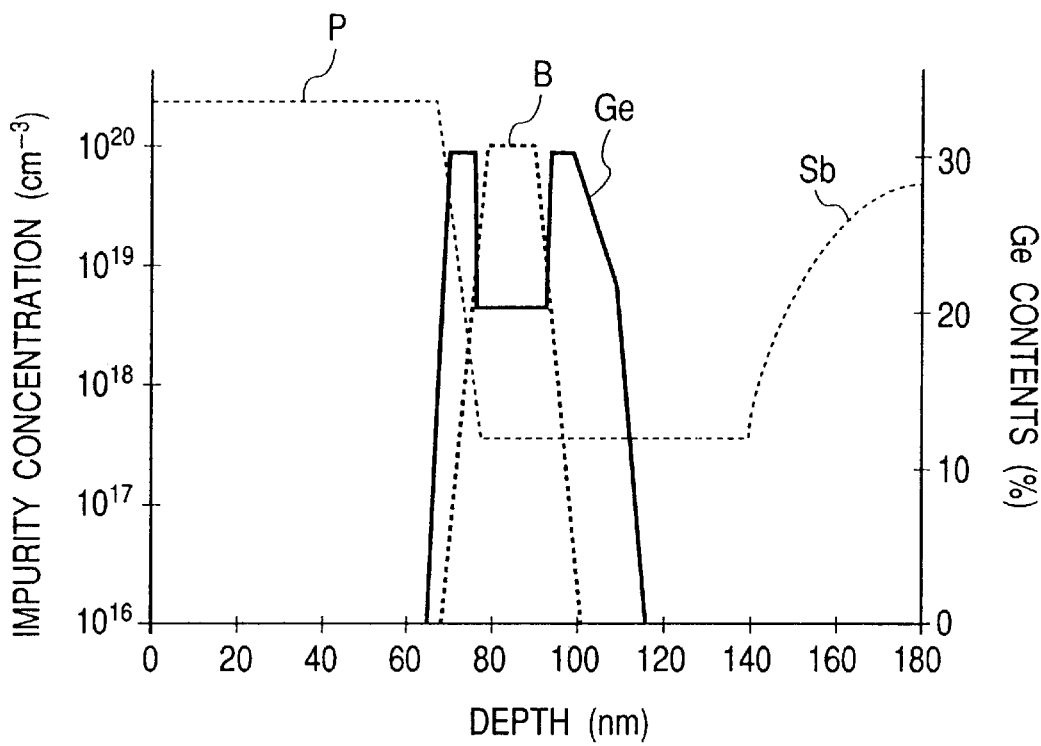
FIG. 1 is a graph showing a depth profile of impurity concentrations and Ge contents of a bipolar transistor using a SiGe alloy for a base in the first embodiment according to the present invention.

FIG. 1 is a graph showing a depth profile of impurity concentrations and Ge contents of the SiGe base transistor in the first embodiment shown in FIG. 3 and FIG. 4, at a portion along a broken line A in FIG. 4. The peak concentration of B in the base layer is $1 \times 10^{20}$ cm$^{-3}$. The Ge content is made uniform as about 20% in the B-doped region and has a substantially trapezoidal profile with the maximum value at about 30% in the emitter-base junction region and in the base-connection junction region adjacent therewith.

Figure 2:
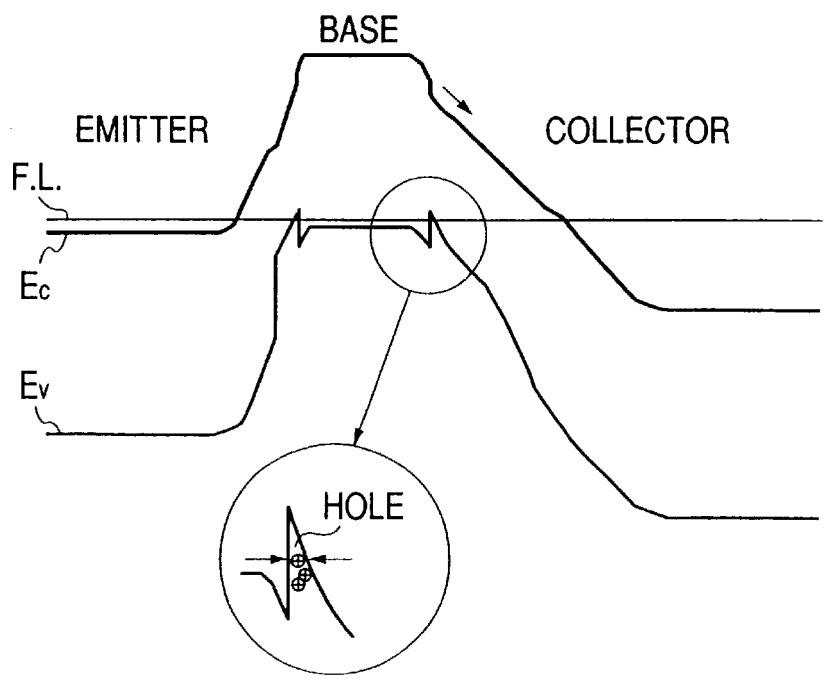
FIG. 2 shows an energy band structure in an active region of an Si bipolar transistor in the first embodiment according to the present invention.

FIG. 2 shows an energy band structure in an active region of the transistor in the first embodiment. As can be seen from the figure, a nodge is formed in the valence band and at the edge of the base layer on the side of the collector. On the other hand, no potential barrier hindering the electron transition is not present in the conduction band.

Figure 5A:
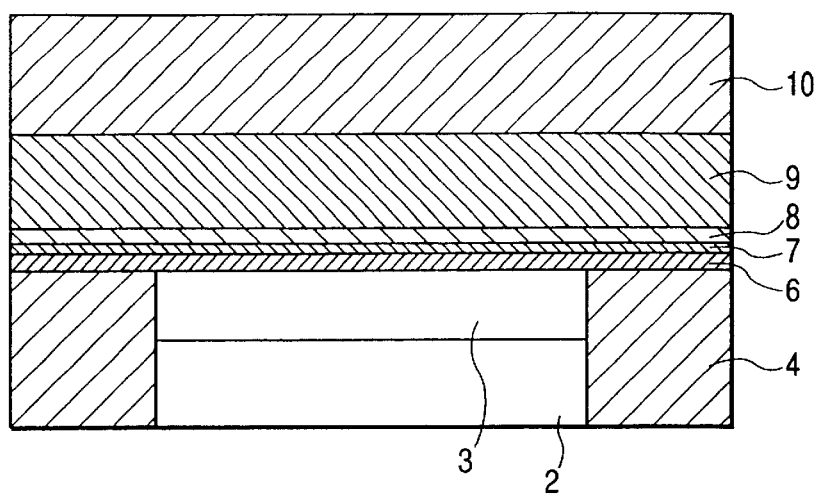
FIG. 5 shows a cross sectional structure for a main portion of main steps in a method of manufacturing a bipolar transistor in the first to the seventh embodiments according to the present invention.
Figure 5B:
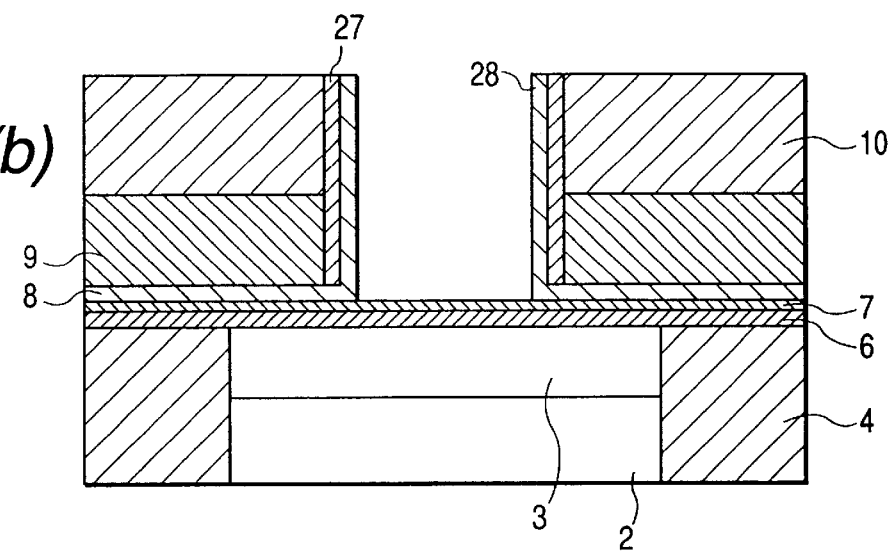
Figure 5C:
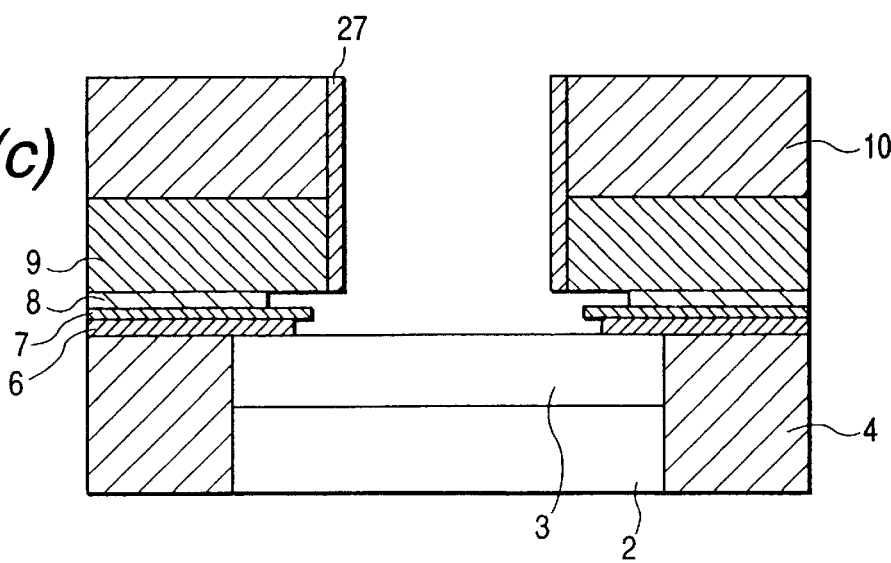
Figure 6D:
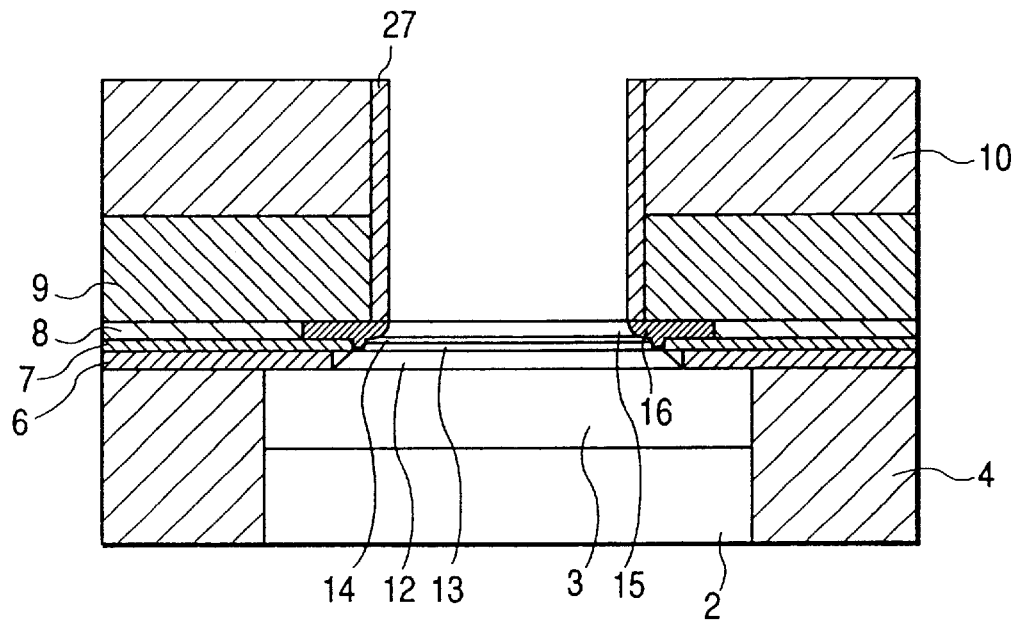
FIG. 6 shows a cross sectional structure for a main portion in main steps of a method of manufacturing a bipolar transistor in the first to the seventh embodiments according to the present invention.
Figure 6E:
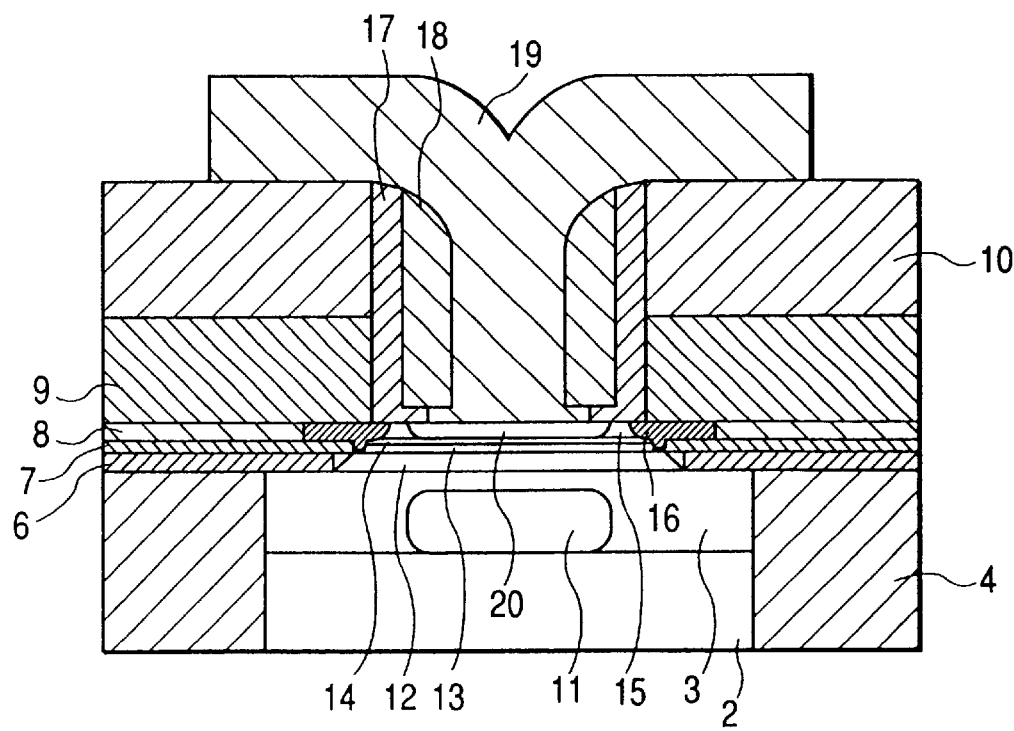

Then, a method of manufacturing an SiGe base transistor in the first embodiment explained with reference to FIG. 1 to FIG. 4 is to be explained with reference to FIG. 5 and FIG. 6. The figures show cross sectional structures for main portions in main steps for manufacturing the transistor. After forming an $n^+$-type Si layer 2 as a buried layer, a low concentration n-type Si layer 3, and an $SiO_2$ film 4 for device isolation on a p-type Si substrate 1, an $SiO_2$ film 6, a non-doped polysilicon layer 7, an $Si_3N_4$ film 8, a p-type polysilicon layer 9 and an $SiO_2$ film 10 are deposited by way of a usual chemical vapor deposition (CVD) method (FIG. 5(a)). Then, an $SiO_2$ film 10 and a p-type polysilicon layer 9 of a portion on the device forming region are removed by usual photolithography and etching to form a window reaching the $Si_3N_4$ film 8. Subsequently, an $SiO_2$ film 27 is deposited by the CVD method and, further, the $SiO_2$ film 27 for the portion other than the side wall of the window is removed by anisotropic dry etching. Then, an $Si_3N_4$ film 28 is deposited by the CVD method and, further, the $Si_3N_4$ film 28 and the $Si_3N_4$ film 8 for the portion other than the side wall of the window are removed by anisotropic dry etching (FIG. 5(b)). Then, the non-doped polysilicon layer 7 exposed to the bottom of the window is removed by wet etching and, further, the $SiO_2$ film 6 exposed thereby to the bottom of the window is removed by wet etching to expose the low concentration n-type Si layer 3 (FIG. 5(c)). Then, a low concentration n-type SiGe film 12, a p-type SiGe film 13, a low concentration n-type SiGe film 14 and a non-doped single crystalline Si layer 15 are selectively grown epitaxially on the low concentration n-type Si layer 3 at the bottom of the window successively by an ultra-high vacuum CVD method. Further, a p-type polycrystal SiGe layer 16 is grown from the exposed portion of the p-type polysilicon layer 9 simultaneously to join with the selective epitaxial layer (FIG. 6(d)). Then, after forming an n-type Si layer 11 by ion implanting P and heating, an $SiO_2$ film 17 and an $Si_3N_4$ film 18 are deposited by a usual CVD method and, further, the $Si_3N_4$ layer 18 and the $SiO_2$ film 17 for the portion other than the side wall of the window are removed by anisotropic dry etching and wet etching. Then, a p-doped $n^+$-type polycrystal Si layer 19 is deposited and heated by the usual CVD method to diffuse P into the non-doped single crystal layer Si 15 to form an $n^+$-type Si layer 20 in the non-doped single crystalline Si layer 15. Further, an $n^+$-type polycrystal Si layer 19 for the portion other than the area just above the opening and the periphery thereof was removed selectively by the usual photolithography and etching (FIG. 6(e)). In the succeeding steps, the transistor shown in FIG. 1–FIG. 4 is completed by way of usual steps of wiring and formation of intermetal layer.

A method of manufacturing bipolar transistors of other embodiments according to the present invention is also identical basically as described above except for making the profiles different between B and Ge in selective epitaxial growing.

In this embodiment, diffusion of B from the B-doped layer to a region adjacent therewith can be suppressed. Therefore, at a B-doped layer width of 20 nm and a peak concentration of $1 \times 10^{20}$ cm$^{-3}$ immediately after the epitaxial growing for instance, the width of the B-doped region after emitter annealing is about 28 nm and it can be reduced to about 70% relative to the width of about 40 mm in the prior art. As a result, this can provide an effect capable of shortening the base transit time of electron to about ½.

Figure 16:
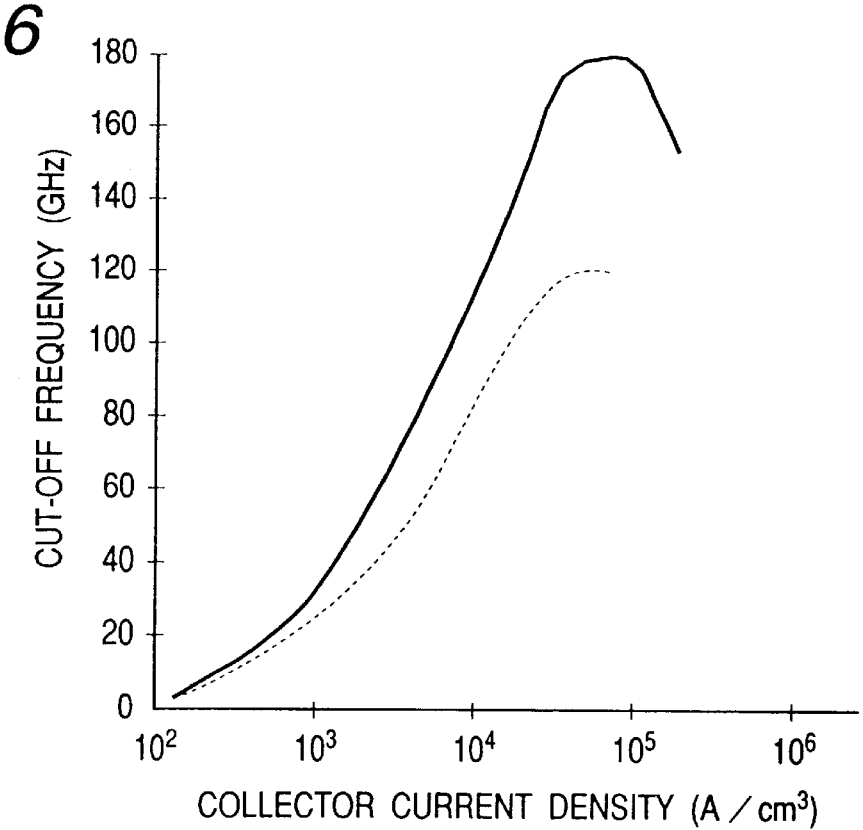
FIG. 16 is a graph comparing the dependency of a highest cut-off frequency on a collector current density between the transistor in the first embodiment according to the present invention and the transistor of the prior art.
Figure 17A:
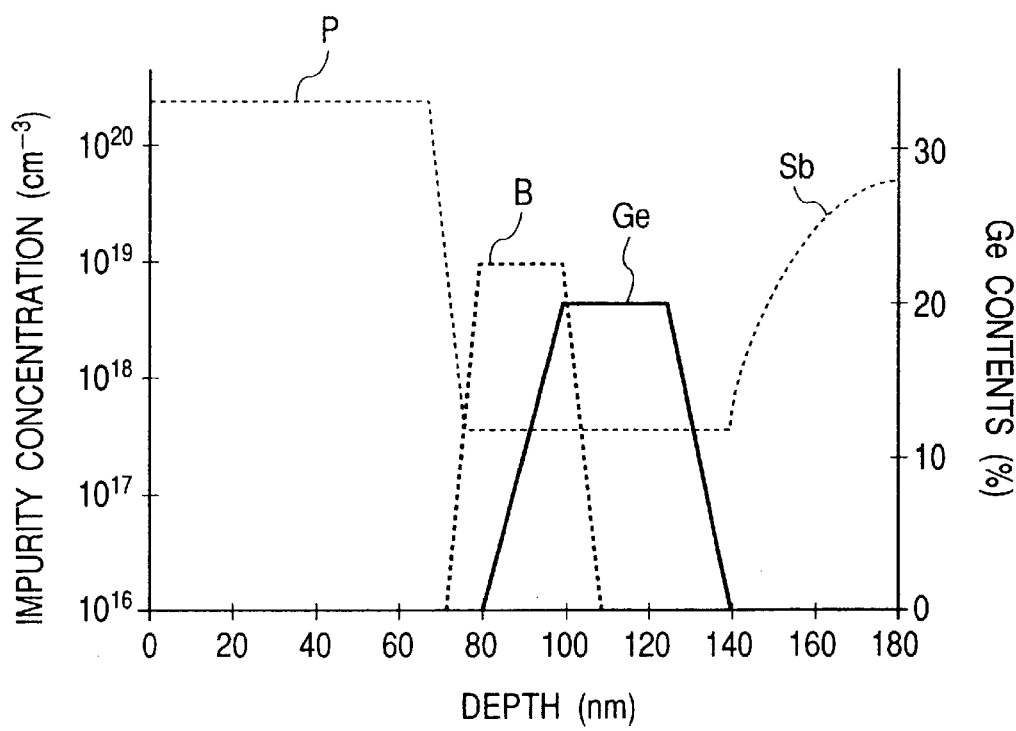
FIG. 17 is a graph showing an example of a depth profile of impurity concentrations and Ge contents in a bipolar transistor using an existent type selectively epitaxially grown SiGe base.
Figure 17B:
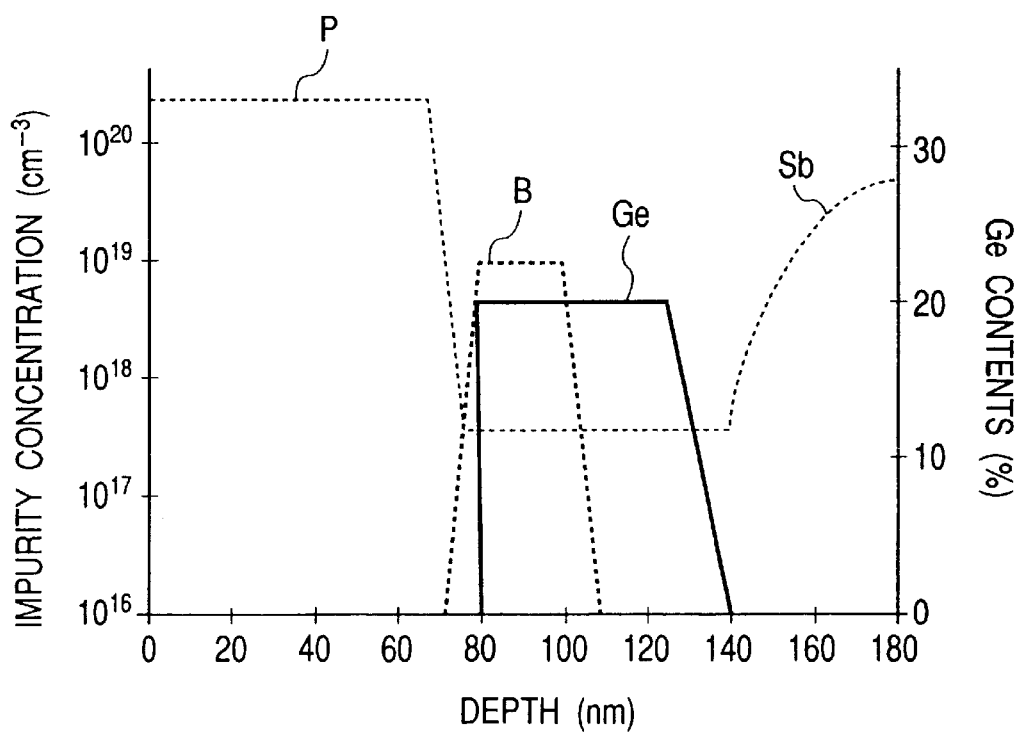
Figure 18:
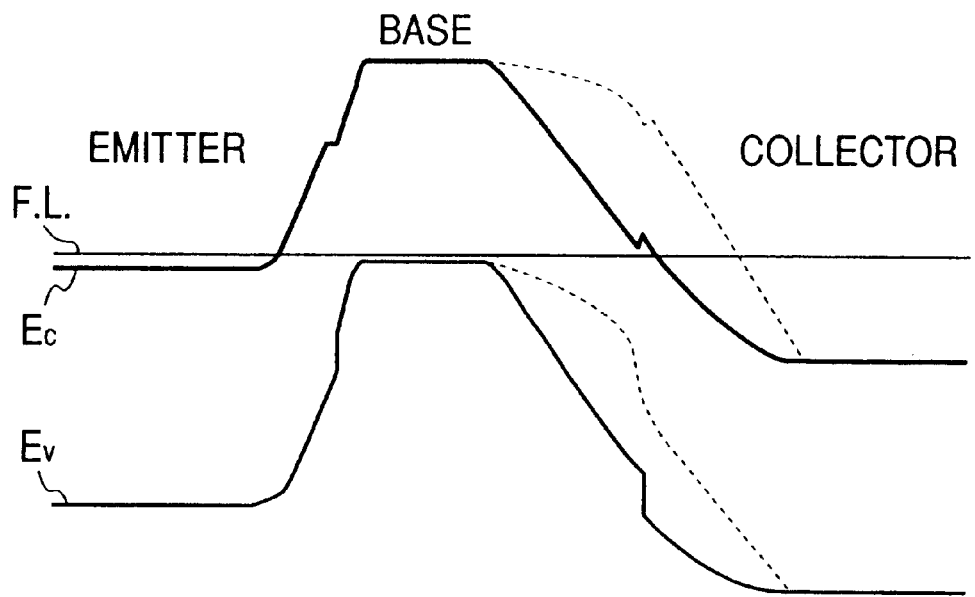
FIG. 18 shows an energy band structure in an active region of a bipolar transistor using an existent type selectively epitaxially grown SiGe base.

Further, in this embodiment, since a nodge is formed to a valence band at the edge of the base layer on the side of the collector, increase in the effective base width due to the increase of the collector current less occurs. Therefore, the collector current at which the cut-off frequency of the transistor becomes maximum is increased by 50%. As a result, this can provide an effect of improving the maximum cut-off frequency to about 40%, in addition to the effect of shortening the base transit time mentioned above. FIG. 16 compares the dependence of the maximum cut-off frequency on the collector current between the transistor of this embodiment and the transistor of the prior art.

Embodiment 2

Figure 7:
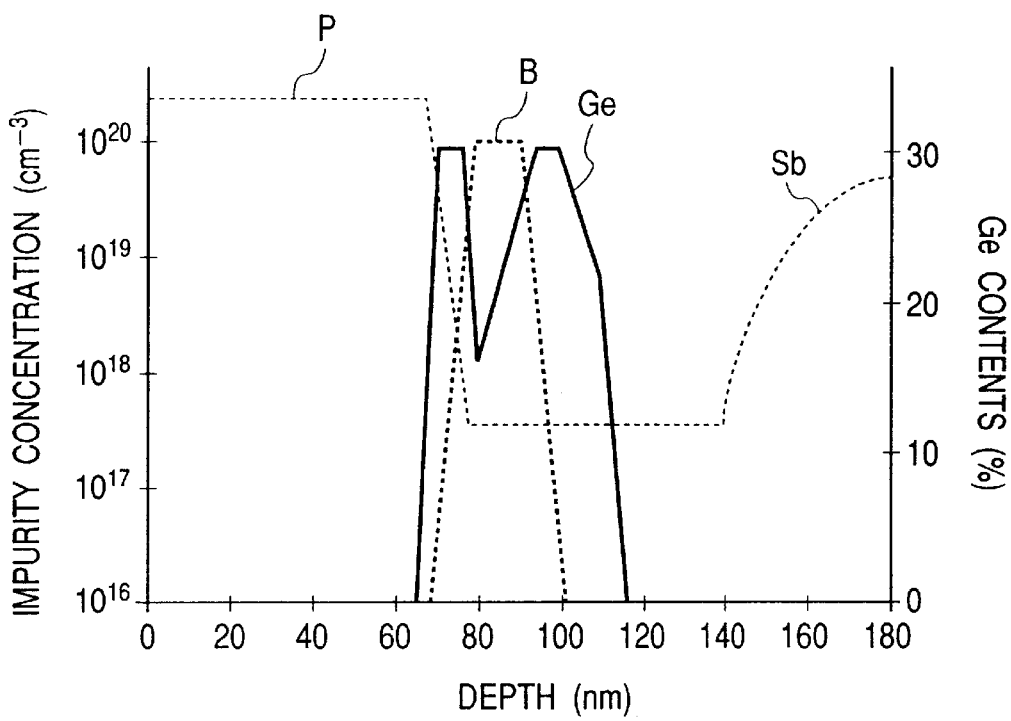
FIG. 7 is a graph showing a depth profile of impurity concentrations and Ge contents of a bipolar transistor in the second embodiment according to the present invention.

The graph shown in FIG. 7 shows a depth profile of impurity concentrations and Ge contents in an SiGe base transistor in a third embodiment according to the present invention at a portion along the broken line A in FIG. 4. The peak concentration of B in the base layer is $1\times10^{20}$ cm$^{-3}$. The Ge content increases from about 15% to about 30% from the B-doped region to the base-collector junction region adjacent therewith. On the other hand, it has a substantially trapezoidal profile with the maximum value of about 30% in the emitter-base junction region adjacent with the B-doped region.

According to this embodiment, since the Ge content has a grade in the base layer, an electric field for accelerating electrons from the emitter to the collector is formed. Therefore, it can provide an effect capable of shortening the base transit time of electrodes further by about 20% compared with that of the transistor in the first embodiment. However, since the total amount of Ge contents is increased compared with that in the first embodiment, it causes a side-effect of increasing the probability for the occurrence of crystal defects.

Embodiment 3

Figure 8:
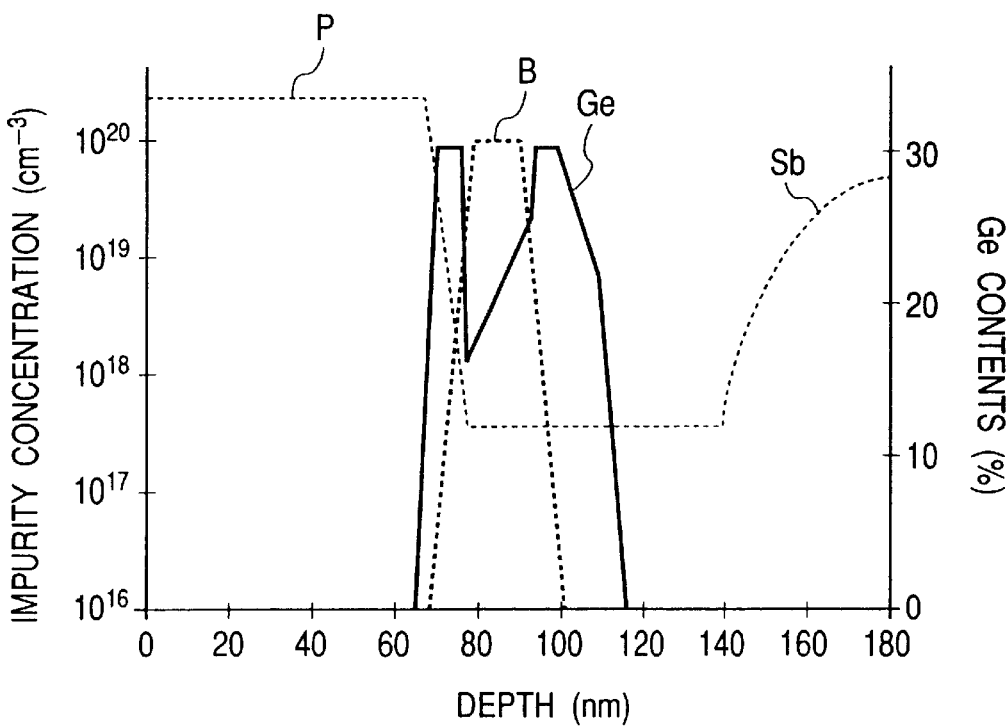
FIG. 8 is a graph showing a depth profile of impurity concentration with and Ge contents of a bipolar transistor in the third embodiment according to the present invention.

The graph of FIG. 8 shows a depth profile of impurity concentrations and Ge contents in the SiGe base transistor in the third embodiment according to the present invention at a portion along the broken line in FIG. 4. The B peak concentration in the base layer is $1\times10^{20}$ cm$^{-3}$. The Ge content increases from about 15% to about 20% in the direction from the emitter to the collector in the B-doped region. On the other hand, it forms a substantially trapezoidal profile with the maximum value of about 30% in the emitter-base junction region and the base-collector junction region adjacent with the B-doped region. The grade of the Ge content on both ends of the B-doped region is greater than the grade in the B-doped region.

According to this embodiment, since the Ge content has a grade in the base layer like that the second embodiment, the base transit time of electrons can be made identical with that of the transistor in the second embodiment. Further, since the total amount of the Ge contents is less than that in the second embodiment, it has an effect capable of reducing the probability for the occurrence of crystal defects to a level substantially equal with that in the first embodiment.

Further, in this embodiment, since a nodge is formed in the valence band at the edge of the base layer on the side of the collector like that in the first embodiment, increase of the effective width of the base due to the increase of the collector current less occurs at which the cut-off frequency of the transistor becomes maximum is increased by 25% and, as a result, it provides an effect of improving the cut-off frequency by 8%.

Embodiment 4

Figure 9:
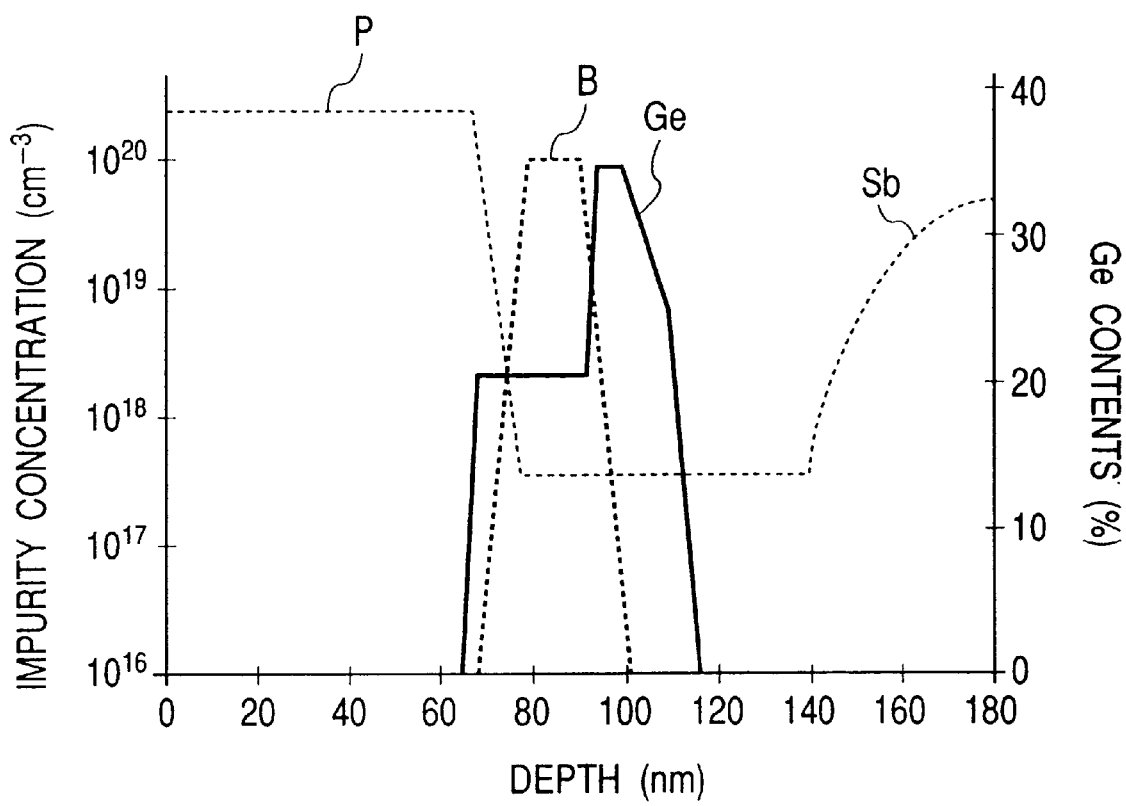
FIG. 9 is a graph showing a depth profile of impurity concentrations and Ge contents of a bipolar transistor in the fourth embodiment according to the present invention.
Figure 10:
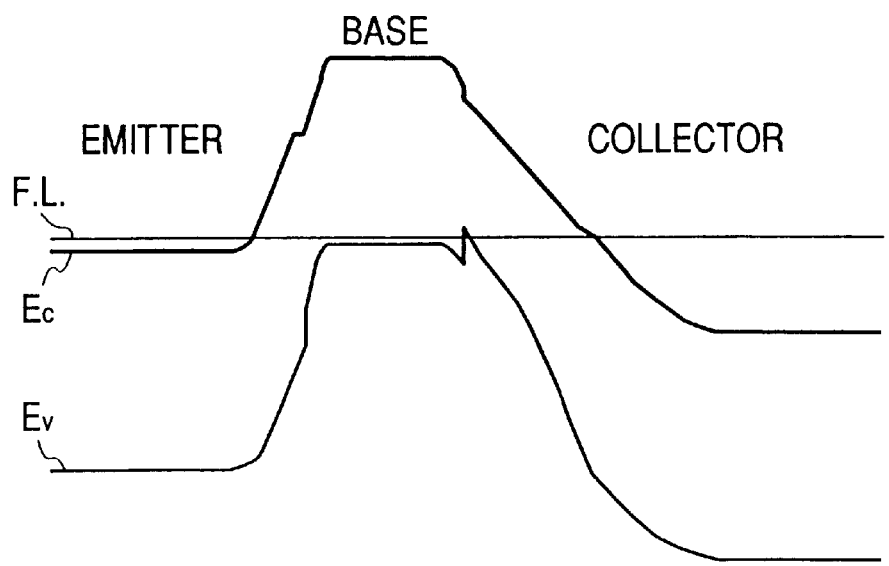
FIG. 10 shows an energy band structure in an active region of a bipolar transistor in the fourth embodiment according to the present invention.

The fourth embodiment according to the present invention is to be explained with reference to FIG. 9 and FIG. 10. FIG. 9 is a graph showing the depth profile of impurity concentrations and Ge contents in the SiGe base transistor in the fourth embodiment according to the present invention at a portion along the broken line A shown in FIG. 4. The B peak concentration in the base layer is $1\times10^{20}$ cm$^{-3}$. The Ge content is uniform as about 20% in the B-doped region and the emitter-base junction region adjacent therewith. On the other hand, it has a substantially trapezoidal profile with the maximum value of about 35% in the base-collector junction region adjacent with the B-doped region. FIG. 10 shows an energy band structure in an active region of the transistor in the fourth embodiment. As can be seen from the figure, a nodge is formed in the valence band at the edge of the base on the side of the collector. Further, no potential barrier inhibiting the electron transition are not present in the conduction band of this transistor.

According to this embodiment, the Ge content is decreased in the emitter-base junction region and, instead, the Ge content is increased in the base-collector region compared with the transistor in the first embodiment. Therefore, the B diffusion speed in the base-collector junction in which B tends to diffuse more can be lowered without increasing the total amount of the Ge contents. As a result, the width of the B-doped region can be decreased by about 7%, that is, to 26 mm compared with the first embodiment. As a result, it can provide an effect capable of reducing the base transit time of electrons by about 14%.

Embodiment 5

Figure 11:
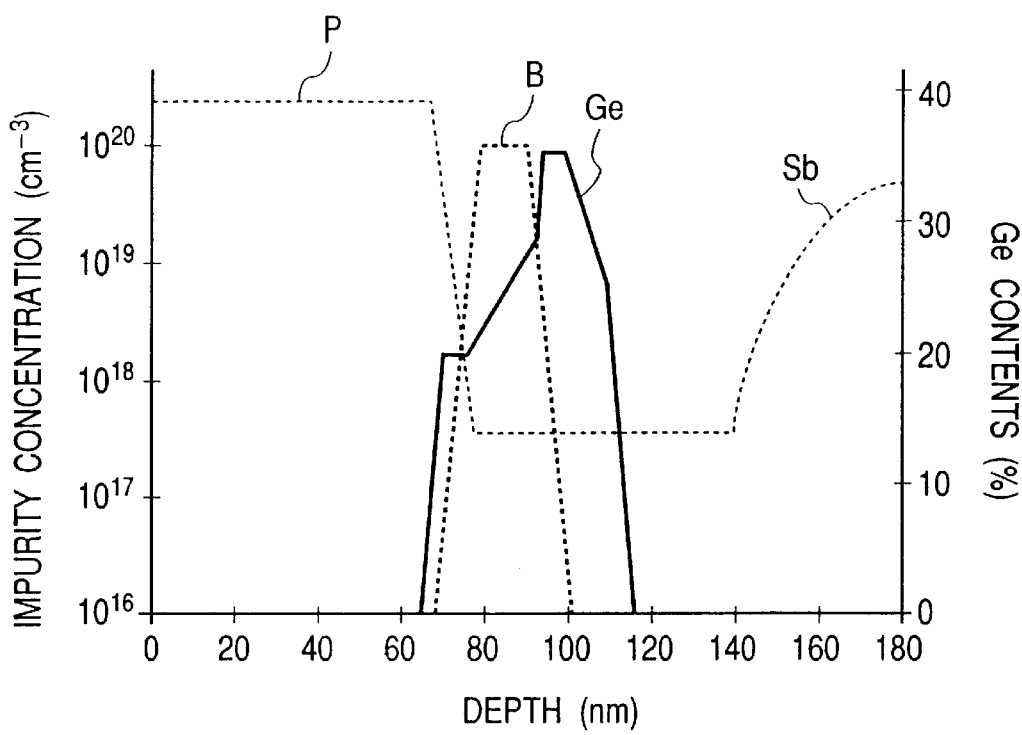
FIG. 11 is a graph showing a depth profile of impurity concentrations and Ge contents of a bipolar transistor in the fifth embodiment according to the present invention.

The graph of FIG. 11 shows the depth profile of the impurity concentrations and Ge contents in the SiGe base transistor in the fifth embodiment according to the present invention at a portion along the broken line A shown in FIG. 4. The B peak concentration is $1\times10^{20}$ cm$^{-3}$ in the base layer. The Ge content increases from about 20% to about 28% in the direction from the emitter to the collector in the B-doped region. On the other hand, a region with a uniform content at about 20% is present in the emitter-base junction region adjacent with the B-doped region. Further, it has a substantially trapezoidal profile with the maximum value of about 35% in the base-collector junction region. The grade of the Ge content at the edge of the B-doped region on the side of the collector is greater than the grade in the B-doped region.

According to this embodiment, since the Ge content has a grade in the base layer, an electric field for accelerating electrons from the emitter to the collector is formed. Accordingly, it can provide an effect capable of decreasing the base transit time of electron further by about 20% compared with the transistor in the fourth embodiment.

Embodiment 6

Figure 12:
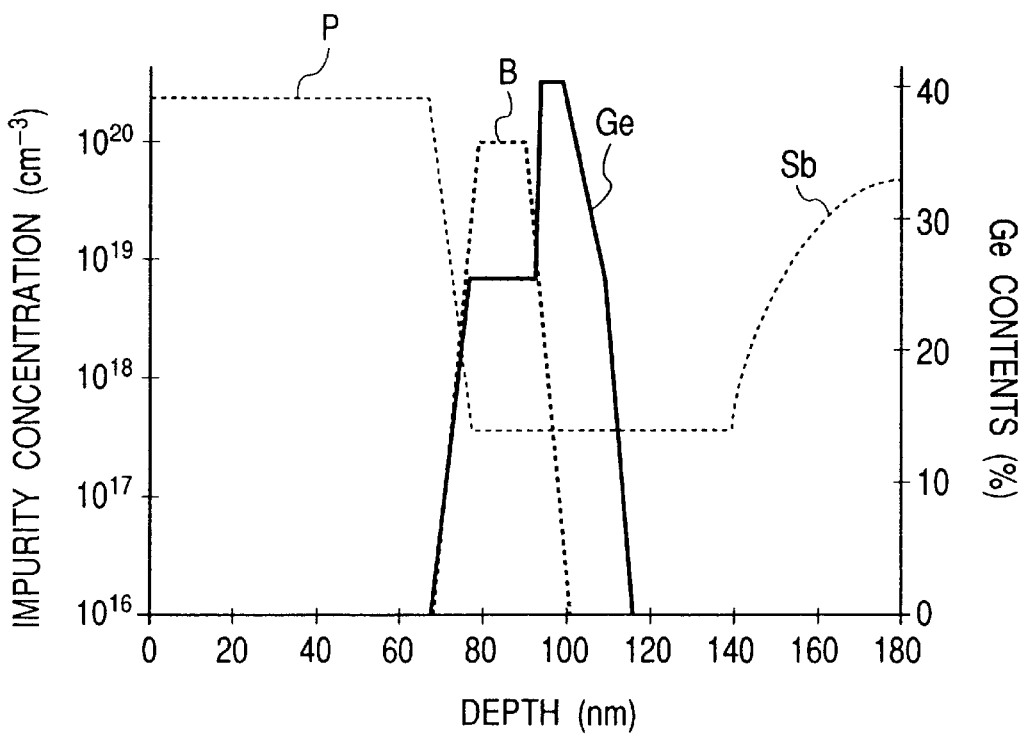
FIG. 12 is a graph showing a depth profile of impurity concentrations and Ge contents of a bipolar transistor in the sixth embodiment according to the present invention.
Figure 13:
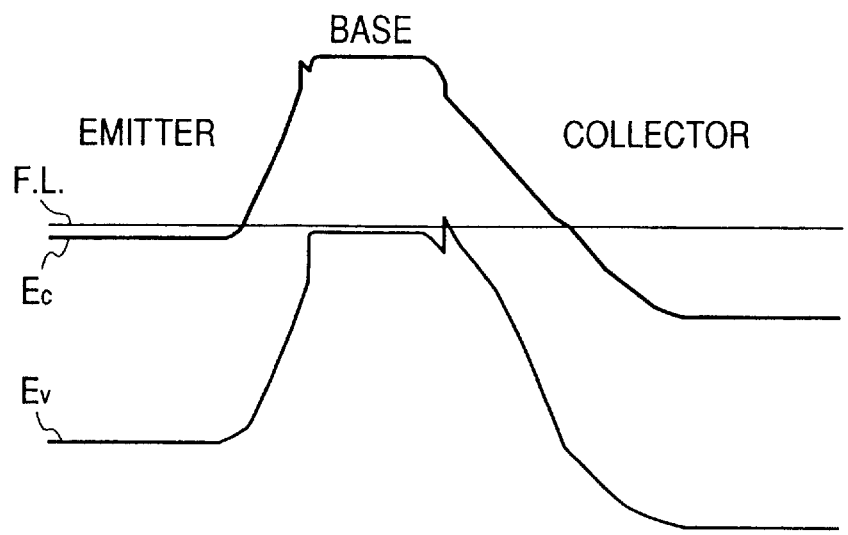
FIG. 13 shows an energy band structure in an active region of a bipolar transistor in the sixth embodiment according to the present invention.

The sixth embodiment according to the present invention is to be explained with reference to FIG. 12 and FIG. 13. FIG. 12 is a graph showing the depth profile of impurity concentrations and Ge contents in the SiGe base transistor in the sixth embodiment according to the present invention at a portion along the broken line A shown in FIG. 4. The B peak concentration in the base layer $1\times10^{20}$ cm$^{-3}$. The Ge content is uniform at about 20% in the B-doped region and decreases abruptly from the edge of the B-doped region to the emitter-collector junction region adjacent therewith. On the other hand, it has a substantially trapezoidal profile with the maximum value of about 40% in the base-collector junction region adjacent with the B-doped region. FIG. 13 shows an energy band structure in an active region of the transistor in the sixth embodiment. As can be seen from the figure, a nodge is formed in the valence band at the edge of the base on the side of the collector. Further, no potential barrier inhibiting the electron transition is present in the conduction band of this transistor.

According to this embodiment, the Ge content in the base-collector junction region is increased more instead of decreasing the Ge content in the emitter-base junction region to 0 compared with the transistor in the fourth embodiment. Accordingly, the B diffusion speed in the base-collector junction can be further lowered without increasing the total amount of Ge contents. As a result, this can provide an effect capable of making the width of the B-doped region and the base transit time of electrons substantially equal with those in the fourth embodiment.

Embodiment 7

Figure 14:
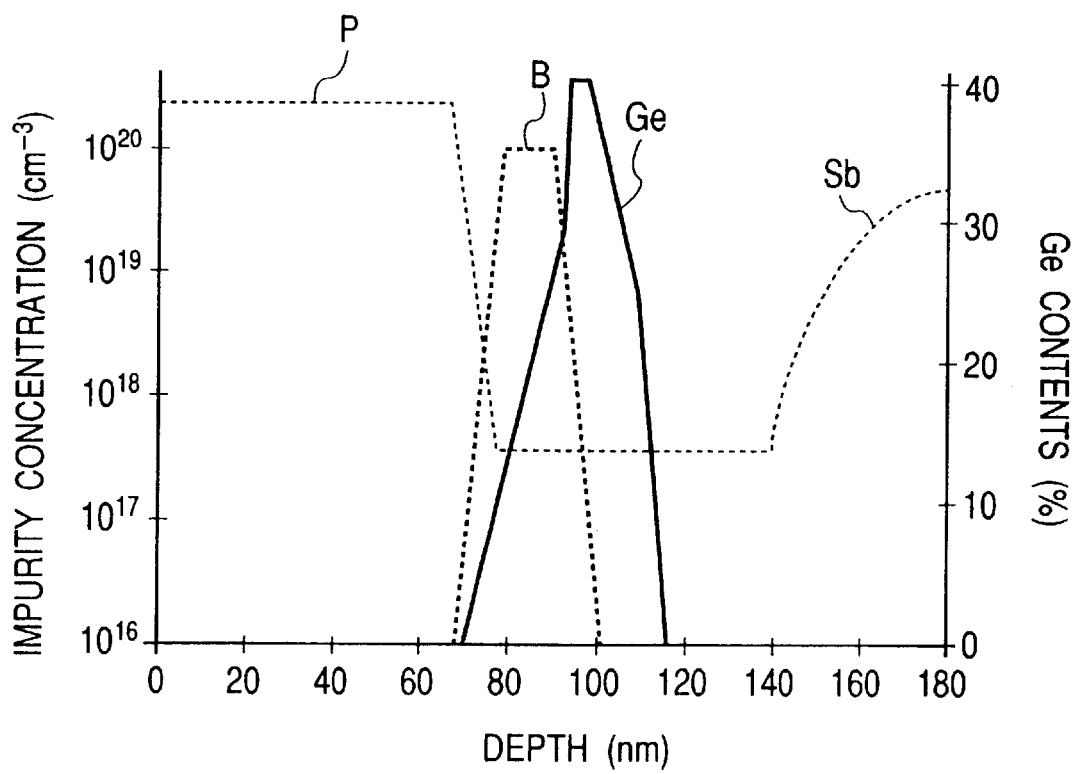
FIG. 14 is a graph showing a depth profile of impurity concentrations and Ge contents of a bipolar transistor in the seventh embodiment according to the present invention.
Figure 15:
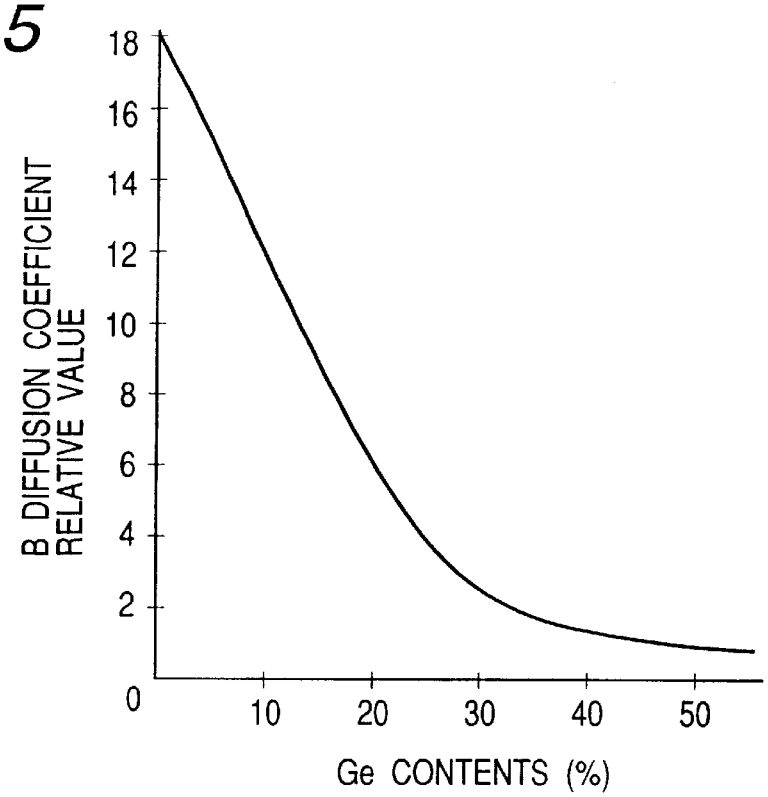
FIG. 15 is a graph showing a relation between a Ge content and a B diffusion coefficient in an SiGe alloy layer.

The graph of FIG. 14 shows the depth profile of the impurity concentrations and the Ge contents in the SiGe base transistor in the seventh embodiment according to the present invention at a portion along the broken line A shown in FIG. 4. The B peak concentration is $1 \times 10^{20}$ cm$^{-3}$ in the base layer. The Ge content increases from about 0% to about 28% in the direction from the emitter to the collector in the B-doped region. On the other hand, it has a substantially trapezoidal profile with the maximum value of about 40% in the base-collector junction region. The grade of the Ge content at the edge of the B-doped region on the side of the collector is larger than the grade in the B-doped region.

According to this embodiment, since the Ge content has a grade in the base layer, an electric field for accelerating electrons from the emitter to the collector is formed. Accordingly, it can provide an effect capable of shortening the base transit time of electrons by further about 20% compared with the transistor in the sixth embodiment.

Embodiment 8

Figure 19:
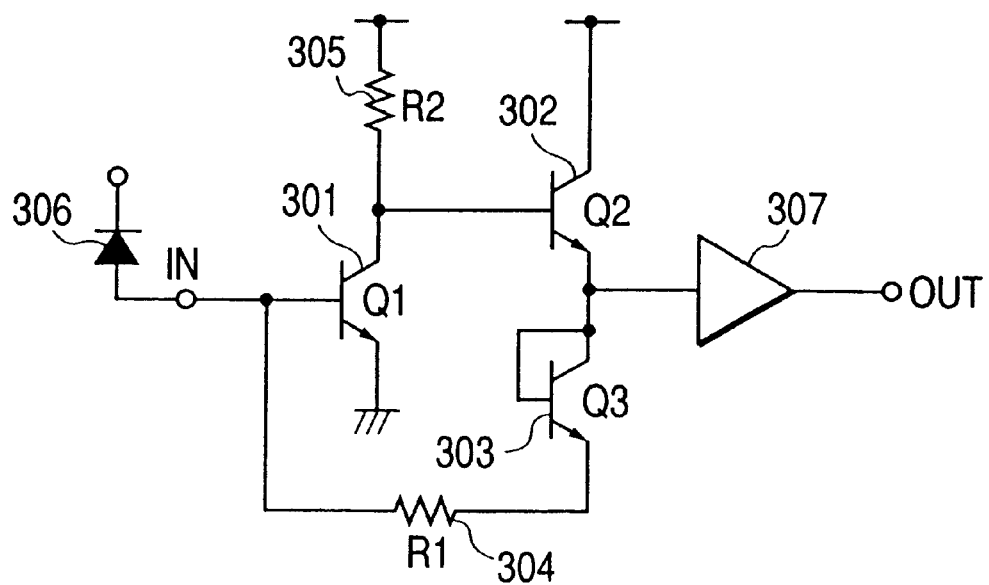
FIG. 19 shows a preamplifier for an optical transmission system in the eighth embodiment according to the present invention.

FIG. 19 shows a diagram for a preamplifier circuit in an optical transmission system illustrating an eighth embodiment according to the present invention. This embodiment is an example of using the SiGe base bipolar transistor in the previous embodiments of a transistor 301 for amplification, and transistors 302 and 303 for a buffer. This is a circuit of amplifying an input from a photodiode 306, and outputting the same from an output buffer 307 by way of an amplifier comprising transistors 301, 302 and 303 and registers 304 and 305. This circuit has a frequency band higher than 40 GHz by the use of the SiGe base bipolar transistor in the embodiment described above.

The frequency band of this circuit can be made to 40 GHz or higher also by using a transistor comprising a compound semiconductor such as GaAs instead of the SiGe base bipolar transistor. However, this embodiment using the SiGe base bipolar transistor has an advantageous feature compared with the case of using the compound semiconductor device in that the cost is reduced since the material for the substrate is inexpensive, consumes less electric power since the shrink of the device manufactured by using the well established Si fabrication processes is easy and the reliability is high since this is an Si series device.

Embodiment 9

Figure 20:
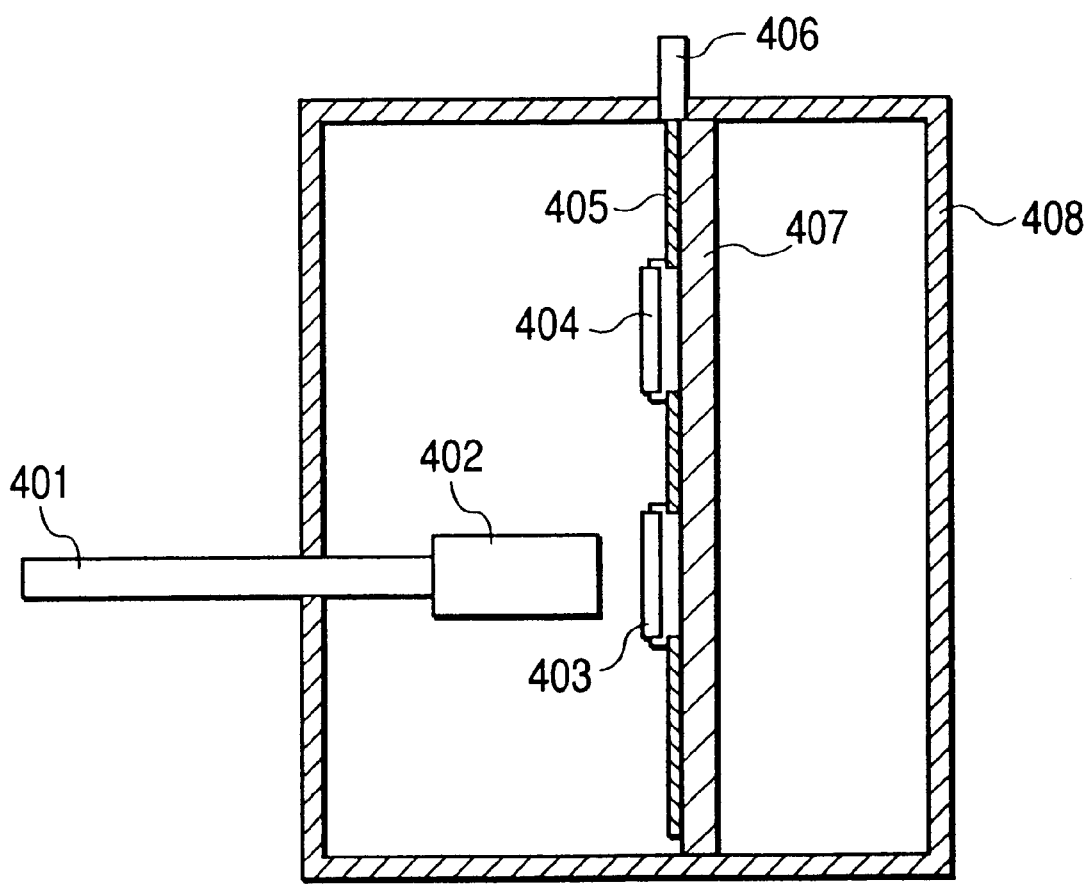
FIG. 20 is a constitutional view for a front-end module of an optical transmission system in the ninth embodiment according to the present invention.

FIG. 20 shows a front-end module including a photodiode and a preamplifier in an optical receiving module showing a ninth embodiment according to the present invention. This embodiment is an example of applying the preamplifier comprising the SiGe base bipolar transistor of the embodiments described previously to a front end module. An optical signal inputted from an optical fiber 401 is focused by a lens 402 and converted by a photodiode IC 403 into an electric signal. The electric signal is amplified by a preamplifier IC 404 through a wiring 405 on a substrate 407 and then outputted from an output node 406.

Embodiment 10

Figure 21:
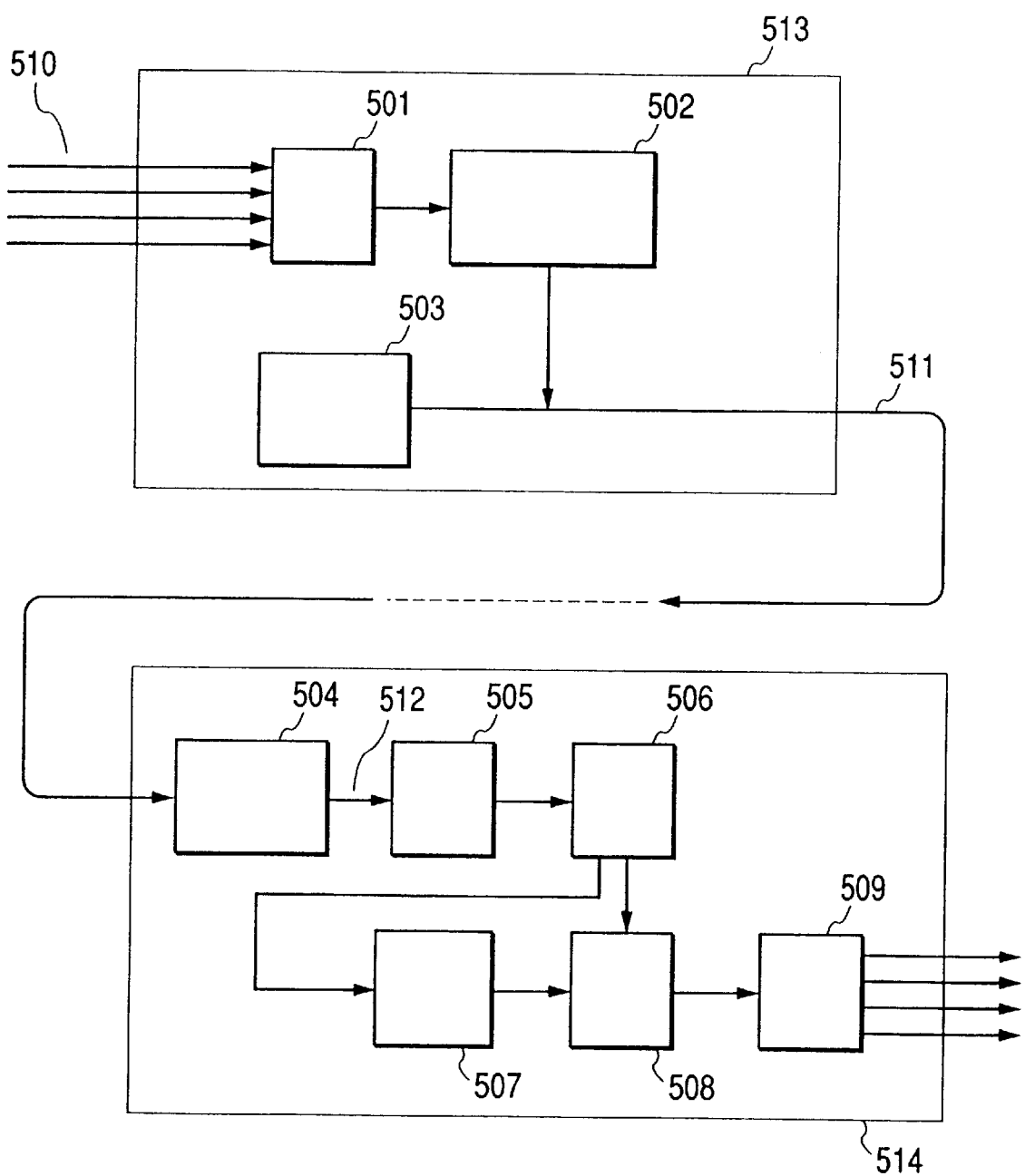
FIG. 21 is a constitutional view of an optical transmission system in the tenth embodiment according to the present invention.

FIG. 21 is a constitutional view for an optical transmission system illustrating a tenth embodiment according to the present invention. This embodiment is an example of applying the SiGe base bipolar transistor of the previous embodiments to the circuits in both of the transmission systems of an optical transmission module 513 for transmitting data at a super-high speed and an optical receiver module 514 for receiving the data.

The module comprises a multiplexer 501 for processing electric signals 510 to be transmitted, a semiconductor laser 503, a semiconductor laser driving analog circuit 502 for driving a semiconductor laser 503, a preamplifier 505 for amplifying a received electric signal 512 prepared by conversion of transmitted optical signal 511 by a photodiode 504, as well as each of analog circuits of an automatic-gain-control amplifier 506, a clock extraction circuit 507 and a decision circuit 508, and a demultiplexer 509 as a digital circuit. In this embodiment, transistors in the multiplexer 501, the analog circuit 502 for the semiconductor laser driver, the preamplifier 505, the automatic-gain-control amplifier 506, the clock extraction circuit 507, the decision circuit 508 and the demultiplexer 509 are SiGe base bipolar transistors in the previous embodiments. Since the SiGe base bipolar transistor has a cut-off frequency and a maximum cut-off frequency as high as 200 GHz, this transmission system can transmit/receive signals at a large capacity of 40 G bits or more per one sec at a super-high speed. This embodiment also has a similar feature as that in the eighth embodiment.

Embodiment 11

Figure 22:
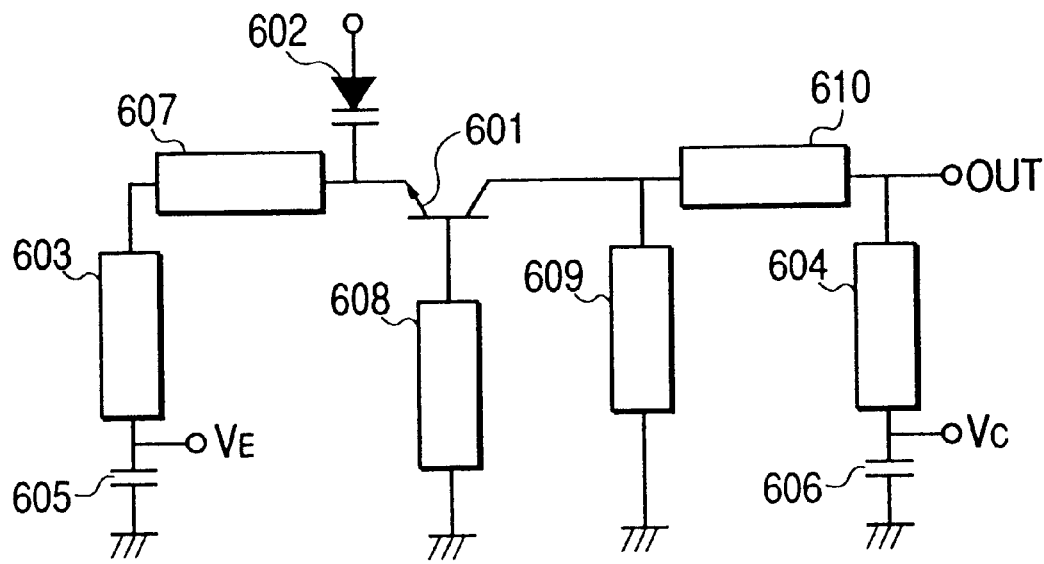
FIG. 22 shows an oscillator in a millimeter wave transmission system in the eleventh embodiment according to the present invention.

FIG. 22 shows an oscillator circuit in a millimeter wave transmission system illustrating an eleventh embodiment according to the present invention. This circuit comprises a transistor 601, a varactor diode 602, ¼λ stubs 603 and 604, feedback stubs 607 and 608 and transmission lines 609 and 610 as a matching circuit. This embodiment is an example of using the SiGe base bipolar transistor in the previous embodiments to the transistor 601. This is a circuit for supplying millimeter wave band frequency signals to a transmission/receiver mixer. This circuit has a band frequency of 60 GHz or higher by using the SiGe base bipolar transistor of the embodiments described previously.

The band frequency of this circuit can be made to 60 GHz or higher also by using a transistor comprising a compound semiconductor such as GaAs instead of the SiGe base bipolar transistor. However, this embodiment using the SiGe base bipolar transistor has an advantageous feature compared with the case of using the compound semiconductor device in that the cost is reduced since the material for the substrate is inexpensive, it consumes less electric power since the shrink of the device is easy by using the well established Si fabrication processes, and the reliability is high since this is an Si device.

Embodiment 12

Figure 23:
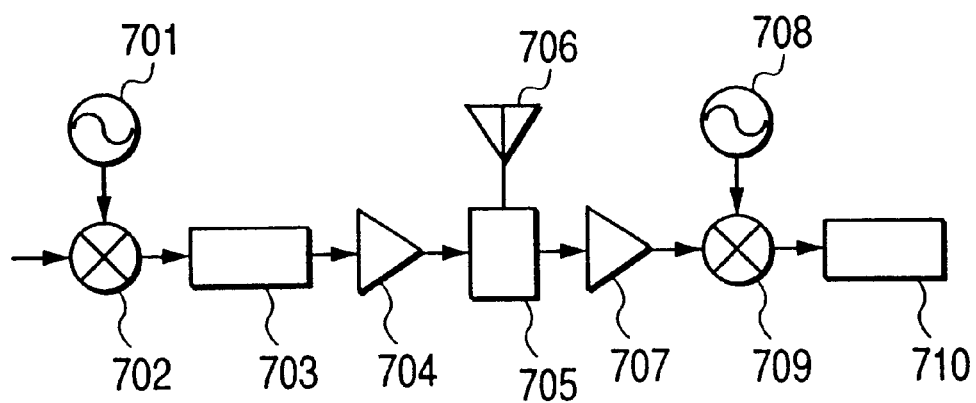
FIG. 23 shows an oscillator in a millimeter wave transmission system in the twelfth embodiment according to the present invention.

FIG. 23 is a constitutional view for a millimeter wave transmission system illustrating a twelfth embodiment according to the present invention. This embodiment is an example of applying the SiGe base bipolar transistor in the previous embodiments to the circuit in the millimeter wave transmission system.

This millimeter wave transmission system comprises a transmitting oscillator 701, a transmitting mixer 702 for receiving a transmission electric signal and stepping up the frequency, filters 703 and 710, a power amplifier 704 for receiving the output from the transmitting mixer, a transmitter/receiver switch 705, a receiving antenna 706 for millimeter wave, a low noise amplifier 707 for amplifying the received electric signal from the antenna, a receiving oscillator 708, and a receiving mixer 709 for receiving the output from the low noise amplifier for stepping-down the frequency. In this embodiment, transistors in the transmitting oscillator 701, the transmitting mixer 702, the power amplifier 704; the low noise amplifier 707, the receiving oscillator 708, and the receiving mixer 709 are SiGe base bipolar transistors in the previous embodiments. Since the cut-off frequency and the maximum cut-off frequency are as high as 200 GHz, this transmitting/receiving system can transmit/receive millimeter wave signals at a frequency of 60 GHz or higher. This embodiment also has the same advantageous features as the eighth embodiment.

According to the present invention, the base diffusion speed in the emitter-base junction region and the base-collector junction region adjacent with the B-doped layer of the base can be lowered. As a result, at the width of the B-doped layer for the base of 20 nm and the peak concentration of $1 \times 10^{20}$ cm$^{-3}$ immediately after epitaxial growing, the width of the B-doped region after emitter annealing is about 26 nm to 28 nm, which can be reduced by about 65% to 70% relative to about 40 mm width in the prior art. As a result, base transit time of electrons can be decreased to about 42%–50%.

Further, according to the present invention, since a nodge is formed in the balance electron band at the edge of the base on the side of the collector, increase of the effective base width due to the increase of the collector current occurs less. Accordingly, the collector current at which the cut-off frequency of the transistor reaches maximum can be increased by about 50% compared with the prior art. As a result, it can provide an effect of improving the maximum cut-off frequency by 40% to 70%, coupled with the effect of shortening the base transit time.

What is claimed is:

1. A bipolar transistor comprising:

a B-doped Si and Ge alloy for a base layer in which the maximum value of Ge content in an emitter-base junction depletion region and a base-collector junction depletion region is greater than average value in the base layer, wherein said Ge content increases abruptly from a vicinity of an edge of the base layer on the emitter side to the emitter, and wherein said bipolar transistor has a flat portion of said Ge content in the base layer.

2. A bipolar transistor according to claim 1, wherein the maximum value of a Ge content in the emitter-base junction depletion region is approximately equal to the maximum value of said Ge content in the base-collector junction depletion region.

3. A bipolar transistor according to claim 2, wherein the maximum value of the Ge content in the base layer is approximately 30%.

4. A bipolar transistor according to claim 2, wherein the maximum of a B concentration in the base layer is approximately $1 \times 10^{20}$ cm$^{-3}$.

5. A bipolar transistor comprising:

a B-doped Si and Ge alloy for a base layer in which the maximum value of Ge content in a base-collector junction depletion region is greater than an average value in the base layer, wherein a grade of said Ge content in a first region in which the grade of Ge content increases from a vicinity of an edge of the base later on a collector side to the collector is greater than a grade of said Ge content in a second region disposed in the base layer and adjacent to said first region, and wherein said bipolar transistor has a flat portion of said Ge content in the base layer.

6. A bipolar transistor according to claim 5, wherein said Ge content increases from the emitter side to a collector side in the most part of the base layer.

7. A bipolar transistor according to claim 5, wherein the maximum Ge content in the base layer is approximately 40%.

8. A bipolar transistor according to claim 7, wherein the maximum of a B concentration in the base, layer is approximately $1 \times 10^{20}$ cm$^3$.

* * * * *